United States Patent [19]

Blyth

[11] 4,434,489
[45] Feb. 28, 1984

[54] AUTOMATIC TEST SYSTEMS

[75] Inventor: Geoffrey C. Blyth, Broxbourne, England

[73] Assignee: Marconi Instruments Limited, Chelmsford, England

[21] Appl. No.: 310,869

[22] Filed: Oct. 13, 1981

[30] Foreign Application Priority Data

Oct. 13, 1980 [GB] United Kingdom ............... 8033007
Sep. 28, 1981 [GB] United Kingdom ............... 8129277

[51] Int. Cl.³ .......................................... G01R 31/28
[52] U.S. Cl. ................................ 371/29; 324/73 AT; 340/705; 340/715; 371/20
[58] Field of Search ............... 371/29, 20; 324/73 R, 324/73 AT, 73 PC; 340/703, 705, 715, 286 M, 524, 525

[56] References Cited

U.S. PATENT DOCUMENTS

| | | | |
|---|---|---|---|
| 2,678,431 | 5/1954 | Lewis | 340/286 M |
| 3,366,950 | 1/1968 | Wilson | 340/705 |
| 3,387,084 | 6/1968 | Hine et al. | 340/705 |
| 4,218,745 | 8/1980 | Perkins | 371/29 |
| 4,222,036 | 9/1980 | Troukens | 340/286 M |
| 4,348,760 | 9/1982 | Rice et al. | 371/20 |
| 4,351,013 | 9/1982 | Matsko et al. | 340/286 M |
| 4,358,732 | 11/1982 | Johnston et al. | 324/73 R |

FOREIGN PATENT DOCUMENTS 2086061 5/1982 United Kingdom ........... 324/73 PC

OTHER PUBLICATIONS

Thompson, Node Forcing Techniques, Marconi Instrumentation, vol. 17, No. 2, May 1980, pp. 31–33.
Emilio et al., New Automatic Test Equipment Emphasizes User Interface, Autotestcon, Nov. 1977, pp. 191–198.

Primary Examiner—Charles E. Atkinson
Attorney, Agent, or Firm—Spencer & Frank

[57] ABSTRACT

The invention provides an automatic test system for testing and diagnosing faults in a printed circuit board carrying electronic components. The system includes an automatic test apparatus provided to receive a circuit board and produce signals indicative of faults therein which are transmitted to a repair station at which batches of faults associated with different tested boards are stored. At the repair station is also stored data enabling a display consisting of individual component parts of the circuit to be displayed and means are provided responsive to the fault indicative signals relating to a particular board for selecting an appropriate portion of the stored data to cause, under the control of a repairer a component part of the circuit wherein faults lie to be displayed in such a fashion that it usually stands out.

14 Claims, 4 Drawing Figures

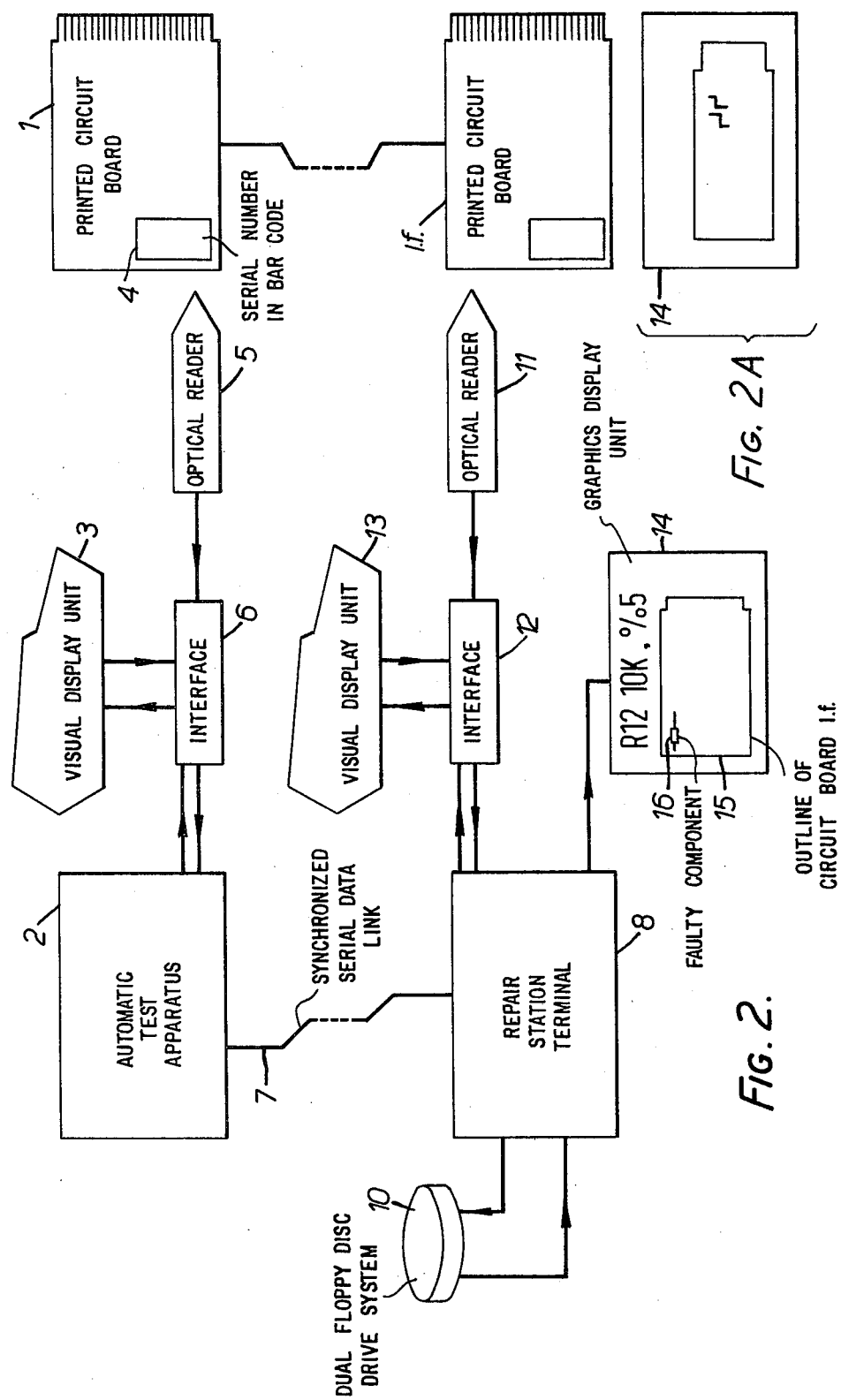

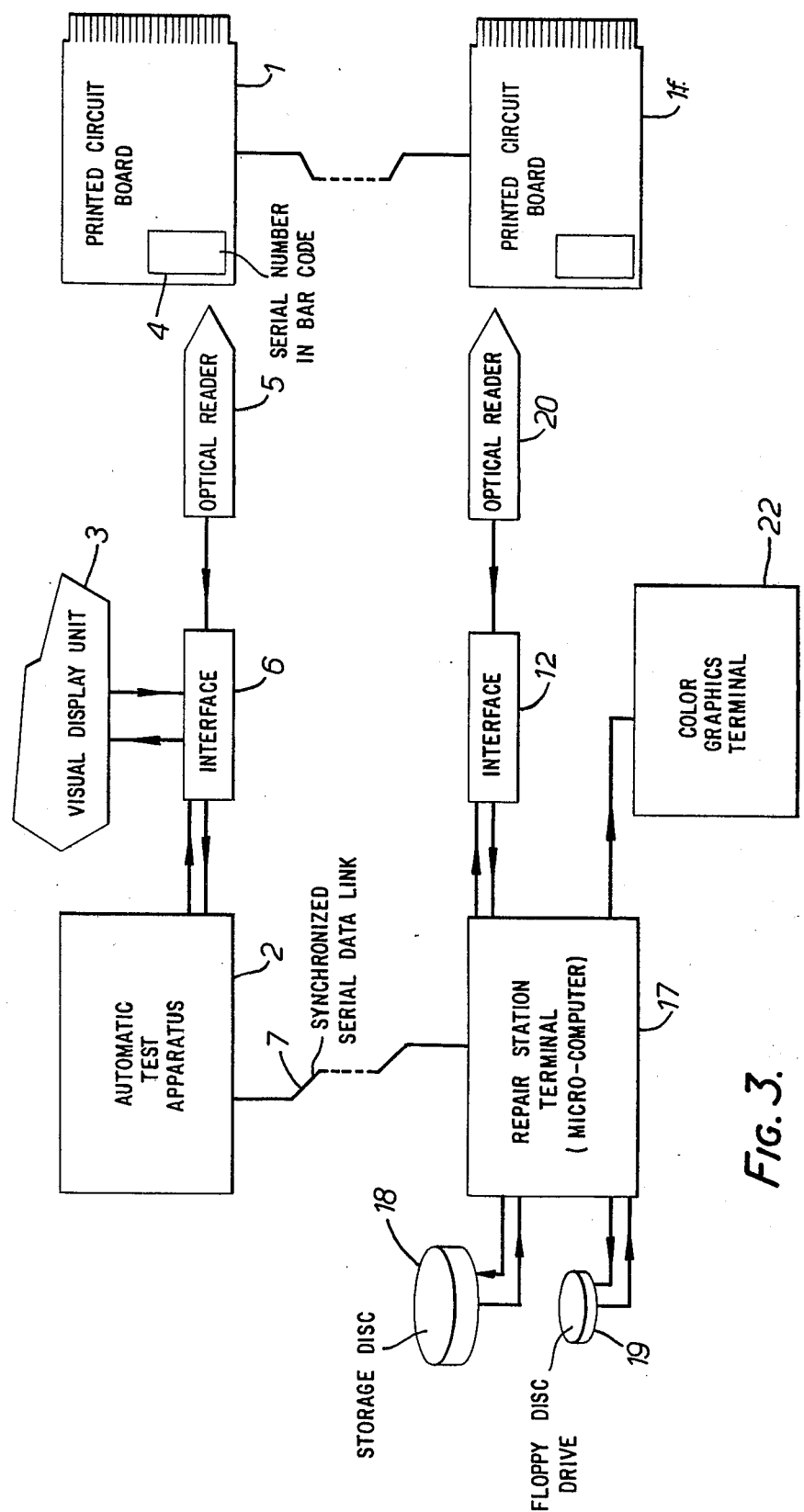

AUTOMATIC TEST SYSTEMS

BACKGROUND OF THE INVENTION

This invention relates to automatic testing systems for use in the automatic diagnoses of faults in electronic circuits such as printed circuit boards bearing electrical components, either following manufacture or following service during which faults have developed.

One example of an automatic test apparatus of the above kind is illustrated in FIG. 1 of the accompanying drawings which is a block schematic diagram.

Referring to FIG. 1, a printed circuit board having mounted thereon electrical components (which are not separately shown) and to be tested is represented at 1. Provided to carry out an automatic test of the printed circuit board is an automatic test apparatus 2 which is in fact a proprietary machine marketed by Marconi Instruments Limited under the trade name "Autotest System 80". It will not be necessary to describe the automatic testing machine in detail but in essence it is mechanically similar to the machine described in the specification of our U.K. Pat. No. 1,530,350. Provision is made to monitor voltage levels at a plurality of different points in the circuit of the printed circuit board 1 and from these readings and from stored information relating to the different voltages values to be expected of a satisfactory board and factors which would be responsible for variations therein, signals are produced which are displayed upon a visual display unit 3 which in this case again is an instrument marketed by Marconi Instruments under the Type Number TK1864. The visual display unit 3 will in operation display such information as "R14 1.02K H" or "short 100 101". This information conveys to the operator that resistor R14 in the circuit has a value of 1.02KΩ which is high or above tolerance and that a short circuit is apparent at a position identified by the positional reference numbers 100 and 101. Whilst examples of only two faults are given, obviously in any given case a greater number of faults may be displayed on the visual display unit 3.

The operator may then enter, by means of the keyboard of the visual display unit 3, the serial number of the printed circuit board 1 under test and obtain a printout showing all of the faults diagnosed in that particular printed circuit board.

In order to avoid the necessity of the operator having to read and enter the serial number of the printed circuit board 1 under test the serial number (represented at 4) may be provided not only in conventional numeric form but also in the form of bar code which is read by an optical reader 5. The block 6 represents a suitable interface e.g. a Type 9300 interface manufactured by Interface Mechanisms Inc of USA.

As so far described the system constitutes an automatic test system which is as well known per se. Such a system is capable of performing automatic tests at a relatively high rate and in practice it is difficult to provide a repair facility which is capable of keeping up with the correction of faults diagnosed by the apparatus.

SUMMARY OF THE INVENTION

One object of the present invention is to provide an automatic test system having a repair facility which eases the task of a repairer in identifying the positions and nature of faults diagnosed by the apparatus whereby to improve the general efficiency with which repairs or corrections may be made.

According to this invention an automatic test system for testing and diagnosing faults in an electronic circuit, such as a printed circuit board carrying electronic components, comprises an automatic test apparatus provided to receive said circuit and produce signals indicative of faults therein, means for transmitting said signals to a repair station, means at said repair station for storing data enabling a display consisting of individual component parts of said circuit to be displayed on a display device and means responsive to said fault indicative signals for selecting an appropriate portion of said stored data to cause a component part of said circuit to be displayed on said display device, corresponding to an actual component part of said circuit wherein a fault lies, in a fashion in which said displayed component part visually stands out.

In one test system in accordance with the present invention the arrangement by which said displayed component part is displayed in a fashion in which it visually stands out is such that only actual component parts which are faulty are displayed.

In a preferred test system in accordance with the present invention, however, the arrangement by which said displayed component part is displayed in a fashion in which it visually stands out is such that actual component parts which are faulty are displayed in one colour whilst actual component parts which are not faulty are displayed in another colour.

Preferably the arrangement is such that under control of a repairer/operator at said repair station one after another of those component parts of said circuit wherein faults lie may be caused to be displayed in their relative positions on said display device.

Normally the arrangement is such that in addition to a component part or component parts of said circuit being displayed an outline corresponding to the outline of said circuit is also displayed in order to assist a repairer/operator to locate the position of the component part being displayed.

Preferably said outline is displayed in a colour which contrasts with the remainder of the display.

Preferably said stored data is such that a repairer/operator may control the display to provide a view as seen from above or below said circuit.

Preferably said display provides, in superimposed fashion, views as seen from above and below said circuit with corresponding parts of the two views being in the same colour but of a different shade or hue.

Each component part of said circuit is preferably an individual electronic component such as a resistor or a capacitor, or a portion of the circuit conductors. Where a component part of said circuit is displayed which consists of a portion of the circuit conductors this will represent the circuit configuration in the immediate vicinity of a fault such as an open circuit or short circuit.

Preferably means are provided at said repair station for storing received signals indicative of faults in an electronic circuit and means are provided for identifying that electronic circuit to which a batch of signals indicative of faults relates.

Preferably said last mentioned means comprises means for adding to a batch of signals indicative of faults transmitted by said automatic test apparatus a code representing a serial number of a tested electronic circuit.

Preferably said last mentioned means comprises an optical reader provided to read a bar code associated with an electronic circuit under test in which case at said repair station an optical reader may also be provided for reading bar codes associated with electronic circuits for repair whereby the appropriate batch of fault indicative signals stored at said repair station may be called up.

Preferably in addition to displaying an outline of an electronic circuit for repair and a component part or parts of said circuit, the display device at said repair station is also arranged to provide readable information concerning the nature of said component part such as the value, tolerance and/or stores part-number of an electronic component such as a resistor or a capacitor.

BRIEF DESCRIPTION OF THE DRAWINGS

FIG. 2 is a block diagram of an automatic test system having a repair facility in accordance with the present invention;

FIG. 2A illustrates the Graphics Display Unit 14 in FIG. 2 with a different display.

FIG. 3 is a block diagram of another embodiment of an automatic test system having a repair facility according to the present invention.

DESCRIPTION OF THE PREFERRED EMBODIMENTS

Figure 1:
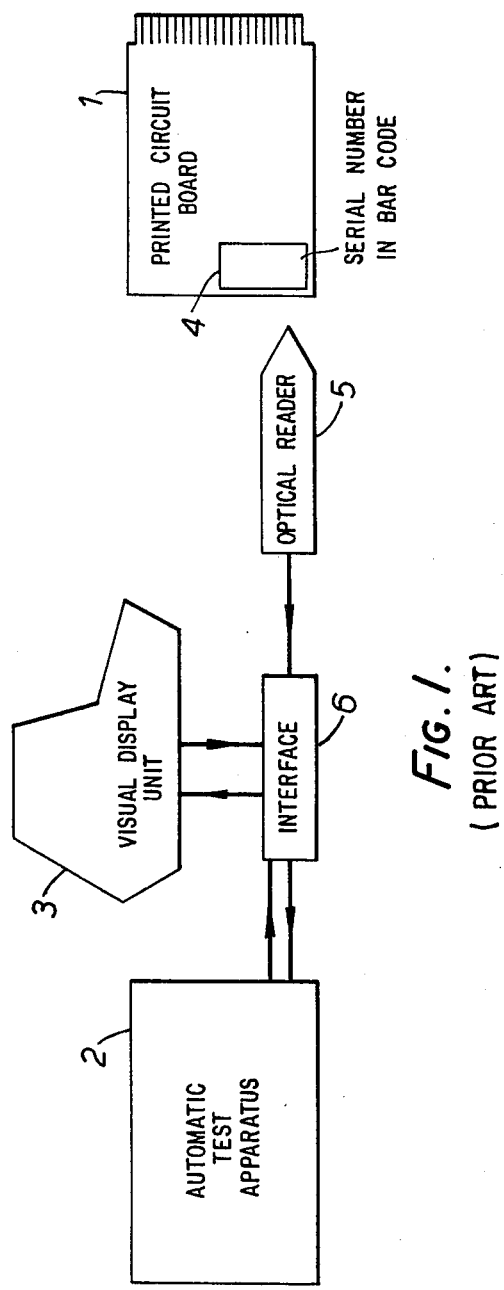
FIG. 1 is a block diagram of a prior art automatic test system for printed circuit boards.

Referring to FIG. 2 in which like references are used for like components in FIG. 1, it will be seen that the automatic test system itself is the same as that described with reference to FIG. 1. However the automatic test machine 2 is provided to apply fault identifying signals not only to the visual display unit 3 but also via a synchronised serial data link 7 to a repair station terminal 8 which may be located at any convenient remote point. The repair station terminal 8 consists of a general purpose interface bus controller (Marconi Instruments Type TK1802) together with a graphics terminal. The controller within 8 is connected to a dual floppy disc drive system 10 (Marconi Instruments Type TK1862/1) which is arranged to provide buffer storage on floppy discs of (a) the serial number of a printed circuit board such as 1 tested and (b) the faults located during such test. Storage is also provided relating to the circuit layout and component location of the printed circuit board such as 1 being tested, viewed from above or below.

Provided to read the bar code serial number of a faulty printed circuit board presented for repair (and represented at 1.f) is an optical reader 11. The output of the optical code reader 11 is connected via a suitable interface 12 (again Type 9300 manufactured by Interface Mechanisms Inc) to the controller within 8. The interface 12 also connects a visual display unit 13 by means of which the repairer/operator may select in turn each fault diagnosed in connection with the board identifed by the bar code read by the optical reader 11.

Connected to the graphics terminal of 8 is a graphics display unit 14. The unit 14 is required only to be used in a display mode but in practice a conventional graphics display unit such as the Tektronix Type 4025 with its remaining functions ignored.

The calling up of each fault in turn produces from the stored information on the floppy discs in the disc drive unit 10 a display such as that represented in the drawing within the block 14. The information display consists of an outline 15 of the circuit board 1.f. and within that outline a representation 16 of the faulty component causing the fault. This representation is shown in a position corresponding to that which the actual component occupies on the printed circuit board 1.f. This enables the repairer quickly and speedily to locate the faulty component on the actual board 1.f. Should the repairer require, the display on the unit 14 may be caused to represent the position of the faulty component 16 as viewed from the underside of the board, by virtue of the alternative information stored on the floppy discs.

In addition to showing the location of the faulty component responsible for a fault, other information is also displayed again derived from the information on the floppy discs. Such information may identify the component number, its value, its tolerance and if required its stores part-number. In the example shown, the resistor is R12 its nominal value is 10K$\Omega$ and its tolerance is 5%.

Having rectified the first fault by replacing the faulty component 16 the repairer/operator may then, by means of the keyboard of the visual display unit 13, command that the next fault be displayed and again a display appears upon the screen of the graphics display unit 14 which shows only that faulty component within the outline 15 of the printed circuit board with again any identifying matter which may be required outside of that outline.

Where a fault consists of a short circuit between two printed circuit conductors or an open circuit, the display presented to the repairer/operator in connection with that particular block on the screen of the VDU consists of a representation of the conductors in the immediate locality of the short circuit or open circuit and in relative position compared to the actual position of the fault on the board so that again the repairer is assisted in identifying the position of the fault. One example of this is illustrated in FIG. 2A.

If the printed circuit boards for repair are not of a kind which bears a serial number in bar code form, then of course the repairer/operator may enter the serial number of the board by means of the keyboard of the visual display unit 13 in order to identify the particular board which is to be repaired.

Referring to FIG. 3, in which like references are again used for like components in FIG. 1, it will be seen that the automatic test system itself is again the same as that described with reference to FIG. 1. However the automatic test machine 2 is provided to apply fault identifying signals not only to the visual display unit 3 but also via a synchronised serial data link 7 to a repair station terminal 8 which may be located at any convenient remote point.

The repair station terminal consists of a micro-computer 17 (DEC LS1-11/23) which controls its activities and a colour graphics terminal 22 together with storage provided by a disc 18 (7½ MByte Winchester disc) which also serves as the system disc containing the executive software. Also included is a floppy disc drive 19 which provides an exchangeable medium for back-up storage and data interchange.

The fault data from the automatic testing station 2 is transmitted to the repair station where it is recorded on disc, together with the serial number of the board that has been examined. Also stored on the disc 18 are data files containing information relating to the broad outline of the board, the layout of the conductors and the arrangement and shape of the components for the printed circuit board that is being tested. The board descriptor files can be entered manually or using automatic generation from CAD (Computer Aided Design) systems.

Provided to read the bar code serial number of a faulty printed circuit board presented for repair (and represented at 1.f.) is an optical reader 20. The output of the optical code reader 20 is connected via a suitable interface 12 (again Type 9300 manufactured by Interface Mechanisms Inc) to the micro-computer. This is connected to a colour graphics terminal 22 which enables the repairer/operator to select in turn each fault diagnosed in connection with the board identified by the bar code read by the optical reader 20.

The micro-computer 17 which controls the acquisition and storage of test results also responds to the operator's request for fault data on particular boards. These two time-shared functions are scheduled on a foreground/background basis i.e. the background function is only given processor time when time is not required for the foreground function. In this case the foreground task is that of acquiring the test results, checking them for correct format and attending to data transmission protocols. The background function is that of searching for fault data for a specified board when requested by the repairer/operator.

When the serial number of a board is entered at the repair station a broad outline of the board is drawn in green on the colour graphics display 22. If the first defect detected by the automatic testing is a faulty component then all the components are displayed in their relative positions on the screen in blue and the faulty one highlighted in red. Information about the component is given at the top of the display indicating such things as type of component, measured value and nature of fault. An area is also provided for any other relevant detail such as stock code number or manufacturer's name.

If the fault is in the printed circuit conductors then all the conductors are drawn, variations in hue distinguishing the conductors on one side of the board from those on the other. An acceptable degree of colour separation can be obtained by using different shades of the same colour, for example by using light blue and dark blue. The faulty conductor or pairs of conductors if the fault is a short, are shown in different colours with red for one conductor, yellow for the other and again hue variation indicates on which side of the board the conductors are positioned.

The colours are chosen to give greatest contrast and reduce confusion caused by the more common types of colour-blindness.

When the operator/repairer has dealt with the first fault the display can be updated to show the next one by operating a single key.

Simultaneously with the generation of the graphics display a fault summary is maintained on the character display which gives overall details of all the faults on the board under repair, and also a warning if the board has circulated around the repair route a number of times.

If the printed circuit boards for repair are not of a kind which bears a serial number in bar code form, then of course the repairer/operator may enter the serial number of the board by means of the keyboard of the visual display unit 13 in order to identify the particular board which is to be repaired.

I claim:

1. An automatic test system for testing and diagnosing faults in an electronic circuit, such as a printed circuit board carrying electronic components, comprising an automatic test apparatus provided to receive said circuit and produce signals indicative of faults therein, means for transmitting said signals to a repair station, means at said repair station for storing data enabling a display consisting of individual component parts of said circuit to be displayed on a display device and means responsive to said fault indicative signals for selecting an appropriate portion of said stored data to cause a component part of said circuit to be displayed on said display device in a position corresponding to the actual position of a component part of said circuit wherein a fault lies and in a fashion in which said displayed component part visually stands out.

2. A test system as claimed in claim 1 the arrangement by which said displayed component part is displayed in a fashion in which it visually stands out is such that only actual component parts which are faulty are displayed.

3. A test system as claimed in claim 1 and wherein the arrangement by which said displayed component part is displayed in a fashion in which it visually stands out is such that actual component parts which are faulty are displayed in one colour whilst actual component parts which are not faulty are displayed in another colour.

4. A system as claimed in claim 1 and further including a keyboard means under control of a repairer/operator at said repair station for causing one after another of those component parts of said circuit wherein faults lie to be displayed in their relative positions on said display device.

5. A system as claimed in claim 1 and wherein the arrangement is such that in addition to a component part or component parts of said circuit being displayed an outline corresponding to the outline of said circuit is also displayed in order to assist a repairer/operator to locate the position of the component part being displayed.

6. A system as claimed in claim 5 and wherein said outline is displayed in a colour which contrasts with the remainder of the display.

7. A system as claimed in claim 1 and wherein said stored data includes data that will provide a view of the component part as seen from above or below said circuit and said means for selecting includes repairer/operator control means for allowing the repairer/operator to select one of such views of the component.

8. A system as claimed in claim 1 and wherein said display provides, in superimposed fashion, views as seen from above and below said circuit with corresponding parts of the two views being in the same colour but of a different shade or hue.

9. A system as claimed in claim 1 and wherein each component part of said circuit is an individual electronic component such as a resistor or a capacitor, or a portion of the circuit conductors.

10. A system as claimed in claim 1 and wherein means are provided at said repair station for storing received signals indicative of faults in an electronic circuit and means are provided for identifying that electronic circuit to which a batch of signals indicative of faults relates.

11. A system as claimed in claim 10 and wherein said last mentioned means comprises means for adding to a batch of signals indicative of faults transmitted by said automatic test apparatus a code representing a serial number of a tested electronic circuit.

12. A system as claimed in claim 11 and wherein said last mentioned means comprises an optical reader provided to read a bar code associated with an electronic circuit under test.

13. A system as claimed in claim 12 and wherein at said repair station an optical reader is also provided for reading bar codes associated with electronic circuit for repair whereby the appropriate batch of fault indicative signals stored at said repair station may be called up.

14. A system as claimed in claim 1 and wherein in addition to displaying an outline of an electronic circuit for repair and a component part or parts of said circuit, the display device at said repair station is also arranged to provide readable information concerning the nature of said component part such as the value, tolerance and/or stores part-number of an electronic component such as a resistor or a capacitor.

* * * * *